United States Patent [19]

Crocker

[11] Patent Number: 4,704,325
[45] Date of Patent: Nov. 3, 1987

[54] POLYMERIC FILMS

[75] Inventor: Christopher Crocker, Bolton Lancs, England

[73] Assignee: Imperial Chemical Industries PLC, London, England

[21] Appl. No.: 801,767

[22] Filed: Nov. 26, 1985

[30] Foreign Application Priority Data

Nov. 26, 1984 [GB] United Kingdom ................ 8429772

[51] Int. Cl.⁴ ........................ B32B 5/16; B32B 15/08; B32B 27/14
[52] U.S. Cl. .................................... 428/323; 428/349; 428/354; 428/458; 428/480; 428/482
[58] Field of Search ............... 428/458, 461, 323, 480, 428/483, 482, 474.4, 412, 336, 349, 354; 528/173

[56] References Cited

U.S. PATENT DOCUMENTS

| | | | |
|---|---|---|---|
| 3,734,874 | 5/1973 | Kilber et al. | 528/173 X |
| 4,250,398 | 2/1981 | Ellis et al. | 428/323 X |
| 4,409,285 | 10/1983 | Swerdlow | 428/483 X |
| 4,476,189 | 10/1984 | Posey et al. | 428/336 |
| 4,525,419 | 6/1985 | Posey et al. | 428/483 X |
| 4,585,687 | 4/1986 | Posey et al. | 428/483 X |

Primary Examiner—Thomas J. Herbert
Attorney, Agent, or Firm—Cushman, Darby & Cushman

[57] ABSTRACT

A metallized film comprises a metallized layer bonded to a thermoplastic polymeric substrate by an adherent layer comprising a sulphonated polyester resin and an ethoxylated alkyl phenol. A polyester such as biaxially orientated polyethylene terephthalate, is a preferred substrate. The films exhibit improved bonding of the metallized layer to the substrate which bonding may be further enhanced by the inclusion of fine particulate filler in the adherent layer, and are of utility in diverse applications including decorative drapes, magnetic recording media and the packaging of liquids.

10 Claims, 3 Drawing Figures

POLYMERIC FILMS

This invention relates to a metallised film and, in particular, to a metallised film comprising a primed polymeric substrate.

Metallic foils, such as aluminium foil, which hitherto have been employed as packaging materials for snack foods, bakery products, potato crisps, coffee beans etc, are increasingly being replaced by less costly metallised film composite structures comprising a substrate of a polymeric film coated with a thin metallic layer. The polymeric film substrate generally provides a strong, flexible packaging medium offering desirable oxygen and moisture barrier properties, and these characteristics are supplemented by the presence of the metallic layer which additionally provides a barrier to visible and ultra-violet light thereby delaying the onset of oxidative degradation to which certain packaged products are vulnerable.

To promote adhesion between a polymeric film and a subsequently deposited metallic layer it is advantageous to employ an intermediate priming layer. Even so, available metallised films are prone to rupture by failure of the adhesive bond between the substrate and metallic layer, particularly if a film package is exposed to impacts, or otherwise mishandled—for example, by being accidentally dropped onto a relatively solid surface.

We have now devised a metallised film exhibiting improved adhesion between the substrate and metallic layer.

Accordingly, the present invention provides a metallised film comprising a substrate layer of a thermoplastics polymeric material having on at least one surface thereof an adherent layer and a metallic layer on the surface of the at least one adherent layer remote from the substrate, wherein the adherent layer comprises (a) a polyester resin containing free sulphonate groups, and (b) an ethoxylated alkyl phenol.

The invention also provides a method of producing a metallised film by forming a substrate layer of a thermoplastics polymeric material, applying to at least one surface thereof an adherent layer, and depositing a metallic layer on the surface of the at least one adherent layer remote from the substrate, wherein the adherent layer comprises (a) a polyester resin containing free sulphonate groups, and (b) an ethoxylated alkyl phenol.

By a free sulphonate group is meant a group of formula $-SO_3R$, wherein R is hydrogen, ammonium, substituted ammonium, or an alkali metal, such as lithium, sodium or potassium, which sulphonate group does not participate in the condensation or ester-interchange reaction by which the adherent polyester resin is formed.

Formation of the adherent polyester resin is conveniently effected in known manner by condensation, or ester-interchange, at temperatures of up to 275° C., and in the presence of a catalyst, of at least one sulphonated polycarboxylic acid, preferably a dicarboxylic acid, or an anhydride or lower alkyl (up to ten carbon atoms in the alkyl group, preferably methyl) ester thereof with at least one polyhydric alcohol. Preferably, the reaction is effected in the presence of at least one unsulphonated polycarboxylic acid, preferably a dicarboxylic acid, or an anhydride or lower alkyl ester thereof, such that the sulphonated polycarboxylic acid comprises up to 35 mole%, and preferably from 5 to 25 mole %, of the total content of polycarboxylic acids in the adherent polyester resin. A suitable method for the preparation of the sulphonated polyester resin is disclosed in U.S. Pat. No. 3,734,874.

Suitable sulphonated polycarboxylic acids for incorporation into the adherent polyester resin include the ammonium and alkali metal, particularly sodium, salts of 4-sulphophthalic acid, 5-sulphoisophthalic acid and sulphoterephthalic acid, or the acid anhydrides or lower alkyl esters thereof.

Unsulphonated polycarboxylic acids suitable for incorporation into the adherent polyester resin include phthalic acid, isophthalic acid, terephthalic acid, cyclohexane-1,4-dicarboxylic acid, adipic acid, sebacic acid, trimellitic acid and itaconic acid, or the acid anhydrides or lower alkyl esters thereof.

Suitable polyhydric alcohols for incorporation into the adherent polyester resin include ethylene glycol, 1-2,propylene glycol, diethylene glycol, neopentyl glycol, cyclohexane-1,4-dimethanol and 1,3-propane diol.

If desired, the adherent polyester resin may be modified by the inclusion therein of one or more monohydric alcohols, such as ethylene glycol monobutyl ether, benzyl alcohol and cyclohexanol.

A preferred adherent polyester resin comprises isophthalic acid, diethylene glycol and sulphoisophthalic acid or sulphoterephthalic acid.

If desired, and preferably, the adherent polyester resin may be cross-linked to improve its durability, hardness, cohesive strength and adhesion to the substrate, and to provide resistance to attack by solvents. Cross-linking may be promoted by incorporation into the resin of any cross-linking agent known to be effective in polyesters. Suitable cross-linking agents include the condensation products of an amine with an aldehyde. For example, melamine, diazine, urea, cyclic ethylene urea, cyclic propylene urea, thiourea, cyclic ethylene thiourea, an alkyl melamine, such as butyl melamine, an aryl melamine, a guanamine, an alkylguanamine, an aryl guanamine, a benzoguanamine, or glycoluril, may be condensed with an aldehyde, such as formaldehyde. The condensation product is preferably alkoxylated, e.g. ethoxylated. A preferred cross-linking agent is a methylated melamine-formaldehyde resin.

The amount of cross-linking agent necessary to promote the required degree of cross-linking will depend, inter alia, on the selected sulphonated polycarboxylic acid, and may be readily determined by simple experimentation. In general, the cross-linking agent suitably comprises up to 25%, and preferably from 2 to 20%, by weight of the sulphonated polycarboxylic acid component of the adherent resin.

Acceleration of the cross-linking may be effected, if desired, by adding a suitable catalyst to the adherent polyester resin. A preferred catalyst for use with an amine-formaldehyde cross-linking agent comprises ammonium chloride, ammonium nitrate, phosphoric acid, citric acid, p-toluene sulphonic acid or p-dodecylbenzenesulphonic acid.

The adherent polyester resin is conveniently applied to the substrate in the form of an aqueous solution or dispersion. Application from an aqueous medium is economically advantageous, avoids the potential explosive and toxicity hazards associated with the use of volatile organic solvents, and eliminates the problem of residual odour frequently encountered when an organic solvent is employed. A polyester resin with a relatively high sulphonate group content can generally be dispersed in hot water alone. However, if the polyester resin is insufficiently polar to disperse or dissolve unaided, dispersion can be accomplished by incorporation of a suitable surfactant. It may be advantageous to dissolve the polyester in a small amount of an organic solvent prior to dispersion in water.

To achieve good wetting and levelling properties of the aqueous resin medium on a thermoplastic film substrate, it is necessary that the surface energy of the aqueous resin medium is less than that of the film substrate. For example, for application to a polyethylene terephthalate film substrate, the surface tension of the aqueous resin medium should be less than about 40 dyne cm$^{-1}$. In general, the ethoxylated alkyl phenol will reduce the surface tension of the resin medium by the required amount, when used in quantities of from 0.5 to 5%, and preferably from 1 to 2.5%, by weight of the polyester resin medium, depending on the other materials present and the conditions used, and we generally find we can obtain very good even coatings without further additives. However, in cases where reduction in surface tension is insufficient to promote good wetting, suitable additional surfactants may be added to the aqueous resin medium. To ensure compatability with the sulphonated polyester resin, it is preferred to employ a surfactant of an anionic, non-ionic or amphoteric character. Suitable surfactants include alkylbenzene sulphonates, sodium alkyl sulphosuccinates, and alcohol ethoxylates.

Deposition of the aqueous solution or dispersion of the adherent polyester resin onto the polymeric substrate layer is effected by a conventional film coating technique—for example, by gravure roll coating, reverse roll coating, dip coating, bead coating, slot coating or electrostatic spray coating. The solution or dispersion is suitably applied in an amount such that the thickness of the adherent resin layer when dried, for example—by heating the coated substrate, will provide an effective bond to the subsequently applied metal layer. Conveniently, the thickness of the dried, adherent resin layer is of the order of 1 micron, or less, and preferably in a range of from 10 to 100 nanometers (nm).

The substrate of a metallised film according to the invention may be formed from any thermoplastics, film-forming polymeric material. Suitable materials include a homopolymer or copolymer of a 1-olefin, such as ethylene, propylene and butene-1, a polyamide, a polycarbonate, and, particularly, a synthetic linear polyester which may be obtained by condensing one or more dicarboxylic acids or their lower alkyl (up to 6 carbon atoms) diesters, e.g. terephthalic acid, isophthalic acid, phthalic acid, 2,5-, 2,6- or 2,7-naphthalenedicarboxylic acid, succinic acid, sebacic acid, adipic acid, azelaic acid, 4,4'-diphenyldicarboxylic acid, hexahydro-terephthalic acid or 1,2-bis-p-carboxyphenoxyethane (optionally with a monocarboxylic acid, such as pivalic acid) with one or more glycols, e.g. ethylene glycol, 1,3-propanediol, 1,4-butanediol, neopentyl glycol and 1,4-cyclohexanedimethanol. A polyethylene terephthalate film is particularly preferred, especially such a film which has been biaxially oriented by sequential stretching in two mutually perpendicular directions, typically at a temperature in the range 78° to 125° C., and preferably heat set, typically at a temperature in the range 150° to 250° C., for example—as described in British Pat. No. 838 708.

A polymeric film substrate for production of a metallised film according to the invention may be unoriented, or uniaxially oriented, but it preferably biaxially oriented by drawing in two mutually perpendicular directions in the plane of the film to achieve a satisfactory combination of mechanical and physical properties. Simultaneous biaxial orientation may be effected by extruding a thermoplastics polymeric tube which is subsequently quenched, reheated and then expanded by internal gas pressure to induce transverse orientation, and withdrawn at a rate which will induce longitudinal orientation. In such a simultaneous stretching process, the adherent polyester resin coating medium is suitably applied to the substrate either before commencement or after conclusion of the stretching operation. Sequential stretching may be effected in a stenter process by extruding the thermoplastics substrate material as a flat extrudate which is subsequently stretched first in one direction and then in the other mutually perpendicular direction. Generally, it is preferred to stretch firstly in the longitudinal direction, i.e. the forward direction through the film stretching machine, and then in the transverse direction. A stretched substrate film may be, and preferably is, dimensionally stabilised by heat-setting under dimensional restraint at a temperature above the glass transition temperature of the film-forming polymer but below the melting temperature thereof.

The adherent polyester resin coating medium may be applied to an already oriented film substrate. However, application of the coating medium is preferably effected before or during the stretching operation.

In particular, it is preferred that the adherent polyester resin coating medium should be applied to the film substrate between the two stages (longitudinal and transverse) of a biaxial stretching operation. Such a sequence of stretching and coating is especially preferred for the production of a coated linear polyester film substrate, such as a coated polyethylene terephthalate film, which is preferably firstly stretched in the longitudinal direction over a series of rotating rollers, coated with the adherent polyester resin medium, and then stretched transversely in a stenter oven, preferably followed by heat-setting.

Prior to deposition of the adherent polyester resin onto the polymeric substrate the exposed surface thereof may, if desired, be subjected to a chemical or physical surface-modifying treatment to improve the bond between that surface and the subsequently applied polyester resin layer. A preferred treatment, because of its simplicity and effectiveness, which is particularly suitable for the treatment of a polyolefin substrate, is to subject the exposed surface of the substrate to a high voltage electrical stress accompanied by corona discharge. Alternatively, the substrate may be pretreated with an agent known in the art to have a solvent or swelling action on the substrate polymer. Examples of such agents, which are particularly suitable for the treatment of a polyester substrate, include a halogenated phenol dissolved in a common organic solvent e.g. a solution of p-chloro-m-cresol, 2,4-dichlorophenol, 2,4,5- or 2,4,6-trichlorophenol or 4-chlororesorcinol in acetone or methanol.

An adherent polyester resin coating may be applied to one or each surface of the polymeric substrate, and one or each adherent polyester resin layer may be subsequently metallised. Alternatively, one surface of the substrate may be uncoated, or may be coated with a layer of a material other than the herein specified sulphonated polyester resin medium. For example, a pressure sensitive adhesive layer may be deposited on the unmetallised surface of a substrate.

Deposition of a metallic layer onto the, or each, adherent polyester resin layer may be effected by conventional metallising techniques—for example, by deposition from a suspension of finely-divided metallic particles in a suitable liquid vehicle, or, preferably, by a vacuum deposition process in which a metal is evaporated onto the adherent resin surface in a chamber maintained under conditions of high vacuum. Suitable metals include palladium, nickel, copper (and alloys thereof, such as bronze), silver, gold, cobalt and zinc, but aluminium is to be preferred for reasons both of economy and ease of bonding to the resin layer.

Metallising may be effected over the entire exposed surface of the adherent resin layer or over only selected portions thereof, as desired.

Metallised films in accordance with the present invention may be prepared in a range of thicknesses governed primarily by the ultimate application for which a particular film is to be employed. Films, having a total thickness in a range extending from 2.5 to 250 microns are of general utility, although for packaging applications a packaging film or from about 10 to 50 microns in total thickness is generally suitable.

The ratio of substrate to adherent polyester resin layer thickness may vary within a wide range, although the thickness of the resin layer preferably should not be less than 0.004% nor greater than 10% of that of the substrate. In practice, the thickness of the polyester resin layer is desirably at least 0.01 micron and preferably should not greatly exceed about 1.0 micron. The metallic layer is conveniently deposited in a thickness from monoatomic proportions to about 50 microns or greater, although a preferred range is from 0.005 to 15.0 microns, and particularly from 0.01 to 0.5 micron.

One or more of the polymeric layers of a metallised film according to the invention may conveniently contain any of the additives conventionally employed in the manufacture of thermoplastics polymeric films. Thus, agents such as dyes, pigments, voiding agents, lubricants, anti-oxidants, anti-blocking agents, surface active agents slip aids, gloss-improvers, prodegradants, ultraviolet light stabilisers, viscosity modifiers and dispersion stabilisers may be incorporated in the substrate and/or adherent resin layer(s), as appropriate. In particular an adherent resin layer, and/or a substrate, may comprise a particulate filler, such as silica, of small particle size. Desirably, a filler, if employed in an adherent resin layer, should be present in an amount not exceeding 50% by weight of the adherent resin, and the particle size thereof should not exceed 0.5, preferably less than 0.3, and especially from 0.005 to 0.2, microns. A filler, if employed in a substrate layer, should be present in a small amount, not exceeding 0.5%, preferably less than 0.2%, by weight of the substrate. The haze characteristics, of a polymeric film containing a filler of larger particle size are such that a metallised film prepared therefrom exhibits an undesirable dull appearance.

Application of decorative and/or descriptive matter to the films of the invention may be effected by conventional printing techniques, for example—by printing an inked pattern directly onto the metallic surface of the film and, optionally, protecting the printed matter by a layer of a protective lacquer. Alternatively, reverse printing techniques may be employed whereby the printed matter is embedded in the film at an interlayer position.

Films according to the invention are of utility in a wide range of applications including decorative drapes, reflective screens, mirrors, solar panels, electrical circuit boards, capacitors, magnetic recording media and packaging wraps and pouches. Such films are of particular utility as the internal liner of bag-in-the-box containers for wines, beer and carbonated drinks.

BRIEF DESCRIPTION OF THE DRAWINGS

The invention is illustrated by reference to the accompanying drawings in which

Referring to FIG. 1 of the drawings, the film comprises a polyester substrate layer 1 having a metallic layer 2 bonded to one surface 3 thereof by an intermediate adherent layer 4 of a sulphonated polyester resin composition according to the invention. Surface 5 of the substrate, remote from metallic layer 2, is uncoated.

Figure 1:
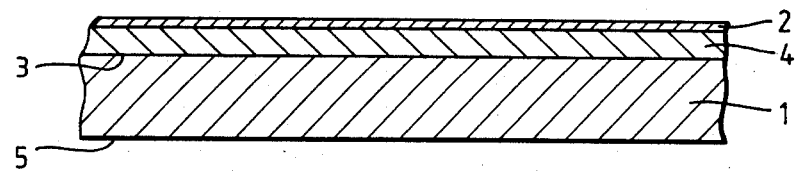
FIG. 1 is a schematic sectional elevation, not to scale, of a polyester film having a single metallic surface layer.
Figure 2:
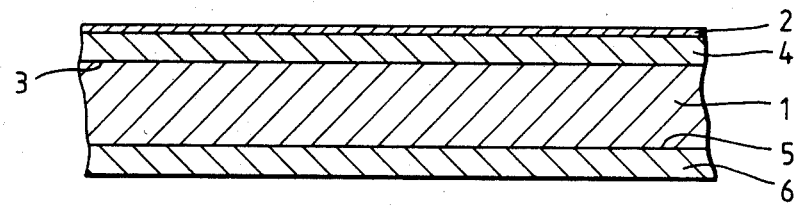
FIG. 2 is a similar schematic elevation of a polyester film having respectively a metallic and an adherent resin surface layer.

The film of FIG. 2 additionally comprises a layer 6 of, for example, an adherent resin medium bonded to the remote substrate surface 5.

Figure 3:
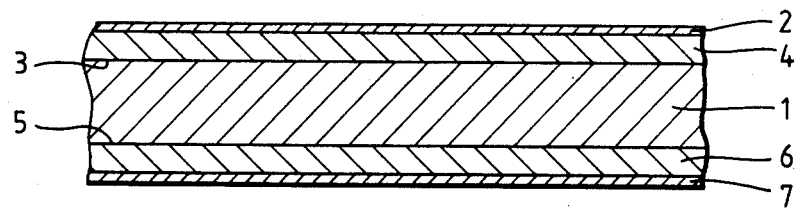
FIG. 3 is a similar schematic elevation of a polyester film metallised on both opposed surfaces.

The film of FIG. 3 further comprises a second metallic layer 7 bonded to a layer 6 of an adherent resin, layer 6 in turn being directly bonded to substrate surface 5.

The invention is further illustrated by reference to the following Examples.

EXAMPLE 1

An amorphous film of polyethylene terephthalate containing about 0.17% of particulate silica (mean particle size 0.5 m) by weight of the polyester was stretched about 3.5 times its original dimensions in one direction and coated on one surface with the following adherent resin composition:

| | |
|---|---|
| Eastman WD Size (aqueous dispersion comprising 30% by weight of a polyester of isophthalic acid, diethylene glycol and a sulpho derivative of a dicarboxylic acid possibly sodium 5-sulphoisophthalate or sodium sulphoterephthalate): | 33 ml |
| 'Cymel' 300 (hexamethoxymethylmelamine) as a 10% w/v aqueous solution: | 5 ml |
| Ammonium salt of p-toluenesulphonic acid, 10% w/v aqueous solution: | 4 ml |
| 'Synperonic' N (25% solution by weight of an ethoxylated nonyl phenol, manufactured by ICI) | 1.5 ml |
| Water: | to 500 ml |

The film was then stretched about 3.5 times in the perpendicular direction and heat set at a temperature of about 200° C. The final thickness of the polyethylene terephthalate substrate film was about 36 microns and the thickness of the adherent resin coating about 30 nanometers.

Aluminium was deposited under vacuum onto the adherent resin surface of samples of the film using an Edwards E306A coating unit ("bell-jar" metalliser). The metal was deposited at a pressure of $10^{-4}$–$10^{-5}$ mbar, and the samples produced had a circular area of metallising ca20 cm in diameter. The amount of metal deposited in each case was controlled as far as possible, to yield a metallised film having a target O.D. (optical density) of about 2.5 (metal thickness 45 nm). No surface pre-cleaning was used, and the substrate was not cooled.

To test the adhesion of the deposited metal, samples of the metallised film were heat-sealed i.e. the metal layer was sealed to a dry adhesive film tape. The seal was achieved using a 'Sentinel' heat-sealer operating at a jaw temperature of 105° C., dwell time of 1 second, and jaw pressure of 50 psi (3.5 kgcm$^{-2}$). This produced a seal 25 mm wide across the sample.

Peel specimens were prepared by cutting 25 mm wide strips at right angles to the seal, giving a sealed area of 25 mm by 25 mm on each sample, with an unsealed 'tail' at least 100 mm long. Five such specimens were cut from each sealed metallised sample, and the adhesion was measured by peeling apart each specimen using an 'Instron' Tensometer at a peel speed of 200 mm/min. The peel load (g/25 mm) was recorded for each specimen and the amount of aluminium transferred to the dry adhesive tape was visually assessed in each case.

Average peel strength (g/25 mm) for the five metallised samples was 1020 g/25 mm. No aluminium was transferred to the adhesive tape.

EXAMPLE 2

This is a comparative Example not according to the invention.

A metallised polyethylene terephthalate film was made by the procedure of Example 1, save that the following adherent resin coating composition was employed:

| | |
|---|---|
| Eastman WD Size, 30% w/w: | 33 ml |
| 'Cymel' 300, 10% w/v: | 5 ml |
| Ammonium p-toluenesulphonate, 10% w/v: | 4 ml |
| 'Zonyl' FSN (nonionic fluorinated surfactant manufactured by DuPont, 40% w/v solution in water/isopropanol): | 1 ml |
| Water: | to 500 ml |

Test results are recorded in the accompanying Table.

EXAMPLE 3

This is a comparative Example not according to the invention.

The procedure of Example 1 was repeated save that the following adherent resin coating composition was employed:

| | |
|---|---|
| Eastman WD Size, 30% w/v: | 33 ml |
| 'Cymel' 300, 10% w/v: | 5 ml |
| Ammonium p-toluenesulphonate, 10% w/v | 4 ml |
| 'Surflon' S 141 (nonionic fluorinated surfactant, manufactured by Asahi Glass Co, Japan; 30% w/v solution in water/isopropanol): | 1.5 ml 1.3 ml |
| Water: | to 500 ml |

Test results are recorded in the accompanying Table.

EXAMPLE 4

The procedure of Example 1 was repeated save that the following adherent resin coating composition was employed:

| | |
|---|---|
| Eastman WD Size, 30% w/v: | 33 ml |
| 'Cymel' 300, 10% w/v: | 5 ml |
| Ammonium p-toluenesulphonate, 10% w/v: | 4 ml |
| 'Synperonic' N | 1.5 ml |
| Potassium Silicate, 10% w/v: | 2 ml |
| Water: | to 500 ml |

The haze value of a sample of the coated, but unmetallised, film (measured according to ASTM D 1003) was the same as that of Example 1.

Other test results are recorded in the accompanying Table.

EXAMPLE 5

The procedure of Example 1 was repeated save that the following adherent resin coating composition was employed

| | |
|---|---|
| Eastman WD Size, 30% w/v: | 33 ml |
| 'Cymel' 300, 10% w/v: | 5 ml |
| Ammonium p-toluenesulphonate, 10% w/v: | 4 ml |
| 'Synperonic' N | 1.5 ml |
| 'Ludox' HS40 (colloidal silica dispersion of mean particle size 12 nm, manufactured by DuPont, 40% w/w) | 6.25 g |
| Water: | to 500 ml |

The haze value of a sample of the coated, but unmetallised, film (measured according to ASTM D 1003) was the same as that of Example 1.

Other test results are recorded in the accompanying Table.

EXAMPLE 6

This is a comparative Example not according to the invention. The procedure of Example 1 was repeated save that no adherent resin coating was applied to either surface of the polyethylene terephthalate substrate film.

Test results are recorded in the accompanying Table.

EXAMPLE 7

This is a comparative Example not according to the invention. The procedure of Example 1 was repeated save that the following adherent resin coating composition was employed:

| | |
|---|---|
| Chempol 44-6040 (30% aqueous solution by weight of a polyester resin containing free-functional carboxylic acid groups, made water-reducible by neutralising with an amine; supplied by Freeman Chemical Co). | 67 ml |
| 'Cymel' 300, 10% w/v | 10 ml |
| Ammonium p-toluenesulphonate, 10% w/v | 4 ml |
| 'Synperonic' N | 1.5 ml |
| Water: | to 500 ml |

Test results are recorded in the accompanying Table.

EXAMPLE 8

This is a comparative Example not according to the invention. The procedure of Example 1 was repeated save the following adherent resin coating composition was employed:

| | |
|---|---|
| Beetle BA 503 (oil-free alkyd resin containing free-functional carboxylic acid groups, supplied by British Industrial Plastics Ltd), dissolved in aqueous ammonia and used as a 10% w/v solution: | 100 ml |
| 'Cymel' 300, 10% w/v: | 20 ml |
| Ammonium p-toluenesulphonate, 10% w/v: | 4 ml |

-continued

| | |
|---|---|
| 'Synperonic' N: | 1.5 ml |
| Water: | to 500 ml |

Test results are recorded in the accompanying Table.

EXAMPLE 9

This is a comparative Example not according to the invention. The procedure of Example 1 was repeated save that the following adherent resin coating composition was employed:

| | |
|---|---|
| Styrene/maleic anhydride copolymer in mole ratio 1:1 partially converted into an n-butyl ester (degree of esterification 35–50%) and neutralised with ammonia (pH 9), commercially available as SMA 1440H (Arco Chemical Co), 30% w/v: | 33 ml |
| 'Cymel' 300, 10% w/v: | 15 ml |
| Ammonium p-toluenesulphonate, 10% w/v: | 4 ml |
| 'Synperonic' N: | 1.25 ml |
| Water: | to 500 ml |

Test results are recorded in the accompanying Table.

TABLE

| Example | Mean peel Strength (g/25 mm) | Aluminium removed (%) |
|---|---|---|
| 1 | 1020 | 0 |
| 2* | 940 | 0 |
| 3* | 1020 | 0 |
| 4 | 1135 | 0 |
| 5 | 1130 | 0 |
| 6* | 225 | 75 |
| 7* | 250 | 95 |
| 8* | 60 | 90 |
| 9* | 175 | 95 |

*Comparative: not according to the invention

The superior peel strength of, and resistance to removal of aluminium from, metallised films comprising a sulphonated polyester adherent resin layer compared with alternative resin layers is evident from the above results.

What is claimed is:

1. A metallised film comprising a substrate layer of a thermoplastics polymeric material having on at least one surface thereof an adherent layer and a metallic layer on the surface of the at least one adherent layer remote from the substrate, wherein the adherent layer comprises (a) a polyester resin containing free sulphonate groups, and (b) an ethoxylated alkyl phenol.

2. A metallised film as claimed in claim 1 in which the adherent polyester resin is a reaction product of a mixture comprising at least one sulphonated polycarboxylic acid, or an anhydride or lower alkyl ester thereof with at least one polyhydric alcohol.

3. A metallised film as claimed in claim 2 in which the reaction mixture also includes at least one unsulphonated polycarboxylic acid, or an hydride or lower alkyl ester thereof, such that the sulphonated polycarboxylic acid comprises from 5 to 25 mole % of the total content of polycarboxylic acids in the adherent polyester resin.

4. A metallised film as claimed in claim 3 in which the adherent polyester resin comprises isophthalic acid, diethylene glycol and sulphoisophthalic or sulphoterephthalic acid.

5. A metallised film as claimed in claim 1 in which the adherent polyester resin has been at least partially cross-linked.

6. A metallised film as claimed in claim 1 in which the ethoxylated alkyl phenol is an ethoxylated nonyl phenol.

7. A metallised film as claimed in claim 1 in which the amount of ethoxylated alkyl phenol is in the range 0.5 to 5% by weight of the polyester resin.

8. A metallised film as claimed in claim 1 in which in addition to the ethoxylated alkyl phenol, the adherent layer contains at least one further surfactant which is anionic, non-ionic or amphoteric.

9. A metallised film as claimed in claim 1 wherein the adherent resin layer contains a particulate filler having a particle size less than 0.5 microns, and being present in an amount of up to 50% by weight of the adherent resin.

10. A metallised film comprising a substrate layer of a thermoplastics polymeric material having on at least one surface thereof an adherent layer and a metallic layer on the surface of the at least one adherent layer remote from the substrate, wherein the adherent layer comprises (a) a polyester resin containing free sulphonate groups and comprising the reaction product of a mixture consisting essentially of (1) at least one sulphonated polycarboxylic acid, or an anhydride or lower alkyl ester thereof, (2) at least one polyhydric alcohol, and (3) at least one unsulphonated polycarboxylic acid, or an anhydride or lower alkyl ester thereof, and (b) an ethoxylated alkyl phenol.

* * * * *